(12) United States Patent
Choi et al.

(10) Patent No.: US 10,436,963 B2
(45) Date of Patent: Oct. 8, 2019

(54) ANTENNA-INTEGRATED POLARIZER AND FLEXIBLE DISPLAY DEVICE USING THE SAME

(71) Applicant: LG Display Co., Ltd., Seoul (KR)

(72) Inventors: Suk Choi, Bucheon-si (KR); Young-Joo Park, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 96 days.

(21) Appl. No.: 15/855,877

(22) Filed: Dec. 27, 2017

(65) Prior Publication Data

US 2018/0188432 A1  Jul. 5, 2018

(30) Foreign Application Priority Data

Dec. 30, 2016  (KR) .................. 10-2016-0184086

(51) Int. Cl.
| | | |
|---|---|---|
| *G06F 3/041* | (2006.01) | |
| *G09G 3/36* | (2006.01) | |
| *G02B 5/30* | (2006.01) | |
| *H01L 51/52* | (2006.01) | |
| *H01L 27/32* | (2006.01) | |
| *G06F 3/044* | (2006.01) | |
| *H01Q 1/22* | (2006.01) | |
| *H01Q 1/44* | (2006.01) | |
| *H01Q 7/00* | (2006.01) | |
| *H01Q 1/24* | (2006.01) | |

(52) U.S. Cl.
CPC ......... *G02B 5/3058* (2013.01); *G02B 5/3033* (2013.01); *G06F 3/044* (2013.01); *G06F 3/0412* (2013.01); *H01L 27/323* (2013.01); *H01L 27/3276* (2013.01); *H01L 51/524* (2013.01); *H01L 51/5253* (2013.01); *H01L 51/5281* (2013.01); *H01Q 1/2266* (2013.01); *H01Q 1/44* (2013.01); *H01Q 7/00* (2013.01); *G06F 2203/04102* (2013.01); *G06F 2203/04103* (2013.01); *H01L 2251/5338* (2013.01); *H01Q 1/243* (2013.01)

(58) Field of Classification Search
CPC ... G02B 5/3033; G02B 5/3058; G06F 3/0412; G06F 3/044; G06F 2203/04102; G06F 2203/04103; H01L 27/323; H01L 27/3276; H01L 51/524; H01L 51/5253; H01L 51/5281; H01L 2251/5338; H01Q 1/2266; H01Q 1/44; H01Q 7/00; H01Q 1/243

See application file for complete search history.

(56) References Cited

U.S. PATENT DOCUMENTS

| | | | | |
|---|---|---|---|---|
| 10,181,648 B2 * | 1/2019 | Liu | ................ | H01Q 9/145 |
| 2016/0056526 A1 * | 2/2016 | Li | ................ | H01Q 9/42 |
| | | | | 343/702 |
| 2018/0034130 A1 * | 2/2018 | Jang | ................ | H01L 27/3225 |

* cited by examiner

*Primary Examiner* — Nelson M Rosario (74) *Attorney, Agent, or Firm* — Polsinelli PC (57) ABSTRACT

Disclosed are an antenna-integrated polarizer and a flexible display device using the same. Shading lines are provided in an active area, and an antenna pattern is provided in a dead area, which surrounds the active area, so as to be electrically connected to the shading lines. Consequently, the reception area of the antenna is increased, and the thicknesses of the antenna and the polarizer are reduced, thereby minimizing folding-resistant force and improving the reliability of the device.

20 Claims, 7 Drawing Sheets

ANTENNA-INTEGRATED POLARIZER AND FLEXIBLE DISPLAY DEVICE USING THE SAME

CROSS-REFERENCE TO RELATED APPLICATION

This application claims the benefit of Korean Patent Application No. 10-2016-0184086, filed on Dec. 30, 2016, which is hereby incorporated by reference in its entirety as if fully set forth herein.

BACKGROUND

Field of the Disclosure

The present disclosure relates to a display device, and more particularly to an antenna-integrated polarizer and a flexible display device using the same. Although the present disclosure is suitable for a wide scope of applications, it is particularly suitable for a flexible display device wherein an antenna is integrated into a polarizer such that the antenna-integrated polarizer is provided in the flexible display device in a slim form, folding-resistant force of the antenna-integrated polarizer is minimized, and reception sensitivity of the antenna-integrated polarizer is improved.

Description of the Background

Concrete examples of display devices may include a liquid crystal display (LCD) device, an organic light-emitting display device, a plasma display panel (PDP) device, a quantum dot display device, a field emission display (FED) device, and an electrophoretic display (EPD) device. These display devices essentially include a flat display panel for displaying images. The flat display panel is configured such that a pair of transparent dielectric substrates is laminated to each other in a state in which an inherent emissive, polarizing, or other optical material layer is disposed therebetween.

Among such display devices, an organic light-emitting display device has attracted considerable attention since reduction of weight is possible through the omission of a light source and excellent color expression is possible.

In addition, with the recent increase in the size of display devices, demand for display devices that occupy small spaces has increased. Furthermore, in recent years, demand for flexible display devices has also increased.

Consequently, display devices have been developed toward flexible display devices, including bendable or rollable display devices that can be bent, folded, or rolled, while having a smaller thickness.

In addition, display devices are required to further include a touchscreen having a touch sensing function in response to specific demands of users, in addition to a simple display function.

Meanwhile, some display devices include an antenna for receiving broadcast or specific data. In general, an antenna is formed by coating the edge of a transparent film with silver (Ag) paste. When such an antenna is applied to a flexible display device including a touchscreen, however, the thickness of the display device is increased, which reduces the flexibility of the flexible display device.

In addition, when the transparent film including the antenna is stacked on the touchscreen, touch sensitivity can be reduced.

In a structure in which the area of the display device is large and an antenna is provided at the edge of the display device, the area of the antenna becomes small, thereby efficiency for electrical signal reception is low and malfunction may be caused due to noise.

SUMMARY

Accordingly, the present disclosure is directed to an antenna-integrated polarizer and a flexible display device using the same that substantially obviate one or more problems due to limitations and disadvantages of the related art.

An object of the present disclosure is to provide an antenna-integrated polarizer wherein an antenna is integrated into a polarizer such that the antenna-integrated polarizer is provided in a display device in a slim form, the folding-resistant force of the antenna-integrated polarizer is minimized, and the reception sensitivity of the antenna-integrated polarizer is improved, and a flexible display device using the same.

Additional advantages, objects, and features of the disclosure will be set forth in part in the description which follows and in part will become apparent to those having ordinary skill in the art upon examination of the following, or may be learned from practice of the disclosure. The objectives and other advantages of the disclosure may be realized and attained by the structure particularly pointed out in the written description and claims hereof as well as the appended drawings.

In an antenna-integrated polarizer according to the present disclosure and a flexible display device using the same, shading lines are provided in an active area, and an antenna pattern is provided in a dead area, which surrounds the active area, so as to be electrically connected to the shading lines. Consequently, the reception area of the antenna is increased, and the thicknesses of the antenna and the polarizer are reduced, thereby minimizing folding-resistant force.

To achieve these objects and other advantages and in accordance with the purpose of the disclosure, as embodied and broadly described herein, an antenna-integrated polarizer includes a substrate having an active area and a dead area defined outside the active area, a plurality of shading lines having a predetermined width provided in the active area of the substrate, metal patterns having the same width as the shading lines provided on the shading lines, and an antenna pattern provided in the dead area so as to surround the active area of the substrate.

The metal patterns and the antenna pattern may be made of the same material.

The edge of the metal patterns may be electrically connected to the antenna pattern.

The metal patterns may be made of aluminum, titanium, chrome, silver, nickel, gold, or an oxide film thereof.

The shading lines may be made of an organic shading material.

The antenna-integrated polarizer may further include a planarization film provided on the substrate having the shading lines and the metal patterns so as to cover at least the active area and a λ/4 plate provided on the planarization film.

The antenna-integrated polarizer may further include a signal connection line connected to the antenna pattern, the signal connection line extending outward from a predetermined portion of one side of the substrate, wherein the signal connection line may be connected to a flexible printed circuit board protruding from one side of the substrate.

A touchscreen may be attached to the surface of the substrate where the shading lines are not formed.

In another aspect of the present disclosure, a flexible display device includes a cover window having a first surface and a second surface, a shading pattern disposed along the edge of the first surface of the cover window, a touch electrode array provided on the first surface of the cover window inside the shading pattern, a routing wire and a touch pad electrode provided on the shading pattern, a first passivation film provided to cover the touch electrode array and the routing wire, a plurality of shading lines having a predetermined width provided on the first passivation film inside the shading pattern, metal patterns having the same width as the shading lines provided on the shading lines, an antenna pattern provided on the first passivation film so as to partially overlap the shading pattern, a second passivation film provided to cover the first passivation film together with the shading lines, the metal patterns, and the antenna pattern, a λ/4 plate provided so as to abut the second passivation film, and a display panel provided so as to abut the λ/4 plate.

In a further aspect of the present disclosure, a flexible display device having an antenna integrated polarizer comprises a cover window including an active area and a non-active area; a shading pattern disposed under the cover window integrated touchscreen in the non-display area; a routing wire and a touch pad electrode disposed under the shading pattern in the non-active area; a touch electrode array disposed in the active area; a plurality of shading lines having a width disposed on the active area; a plurality of metal patterns on the plurality of shading lines and having a same width as the plurality of shading lines, wherein the plurality of shading lines and the plurality of metal patterns cover the touch electrode array and the routing wire and perform polarization; and an antenna pattern electrically connected to the plurality of metal patterns.

The flexible display device may further include a signal connection line connected to the antenna pattern, the signal connection line extending outward from a predetermined portion of one side of the substrate, wherein the signal connection line may be connected to a flexible printed circuit board protruding from one side of the substrate.

The flexible display device may further include a first flexible printed circuit board connected to the touch pad electrode and to the antenna pattern.

One side of the display panel may be connected to a second flexible printed circuit board, and the first flexible printed circuit board may be electrically connected to the second flexible printed circuit board.

Alternatively, the flexible display device may further include a first flexible printed circuit board connected to the touch pad electrode and a second flexible printed circuit board connected to one side of the display panel.

A portion of the antenna pattern may be connected to a connector including a signal connection line protruding outward from the first passivation film, and the connector may be connected to the first flexible printed circuit board or to the second flexible printed circuit board.

It is to be understood that both the foregoing general description and the following detailed description of the present disclosure are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this application, illustrate aspect(s) of the disclosure and together with the description serve to explain the principle of the disclosure.

In the drawings.

DETAILED DESCRIPTION

The advantages and features of the present disclosure and the way of attaining them will become apparent with reference to aspects described below in detail in conjunction with the accompanying drawings. The present disclosure, however, are not limited to the aspects disclosed hereinafter and may be embodied in many different forms. Rather, these exemplary aspects are provided so that this disclosure will be through and complete and will fully convey the scope to those skilled in the art. The scope of the present disclosure should be defined by the claims.

In the drawings for explaining the exemplary aspects of the present disclosure, for example, the illustrated shape, size, ratio, angle, and number are given by way of example, and thus, are not limited to the disclosure of the present disclosure. Throughout the present specification, the same reference numerals designate the same constituent elements. In addition, in the following description of the present disclosure, a detailed description of known functions and configurations incorporated herein will be omitted when it may make the subject matter of the present disclosure rather unclear. The terms "comprises," "includes," and/or "has", used in this specification, do not preclude the presence or addition of other elements unless it is used along with the term "only". The singular forms "a," "an," and "the" are intended to include the plural forms as well, unless the context clearly indicates otherwise.

In the interpretation of constituent elements included in the various aspects of the present disclosure, the constituent elements are interpreted as including an error range even if there is no explicit description thereof.

In the description of the various aspects of the present disclosure, when describing positional relationships, for example, when the positional relationship between two parts is described using "on", "above", "below", "aside", or the like, one or more other parts may be located between the two parts unless the term "directly" or "closely" is used.

In the description of the various aspects of the present disclosure, when describing temporal relationships, for example, when the temporal relationship between two actions is described using "after", "subsequently", "next", "before", or the like, the actions may not occur in succession unless the term "directly" or "just" is used.

In the description of the various aspects of the present disclosure, although terms such as, for example, "first" and "second" may be used to describe various elements, these terms are merely used to distinguish the same or similar elements from each other. Therefore, in the present specification, an element modified by "first" may be the same as an element modified by "second" within the technical scope of the present disclosure unless otherwise mentioned.

The respective features of the various aspects of the present disclosure may be partially or wholly coupled to and combined with each other, and various technical linkages and driving thereof are possible. These various aspects may be performed independently of each other, or may be performed in association with each other.

Hereinafter, an antenna-integrated polarizer and a flexible display device using the same will be described in detail with reference to the accompanying drawings.

An Aspect of Antenna-Integrated Polarizer

Figure 1:
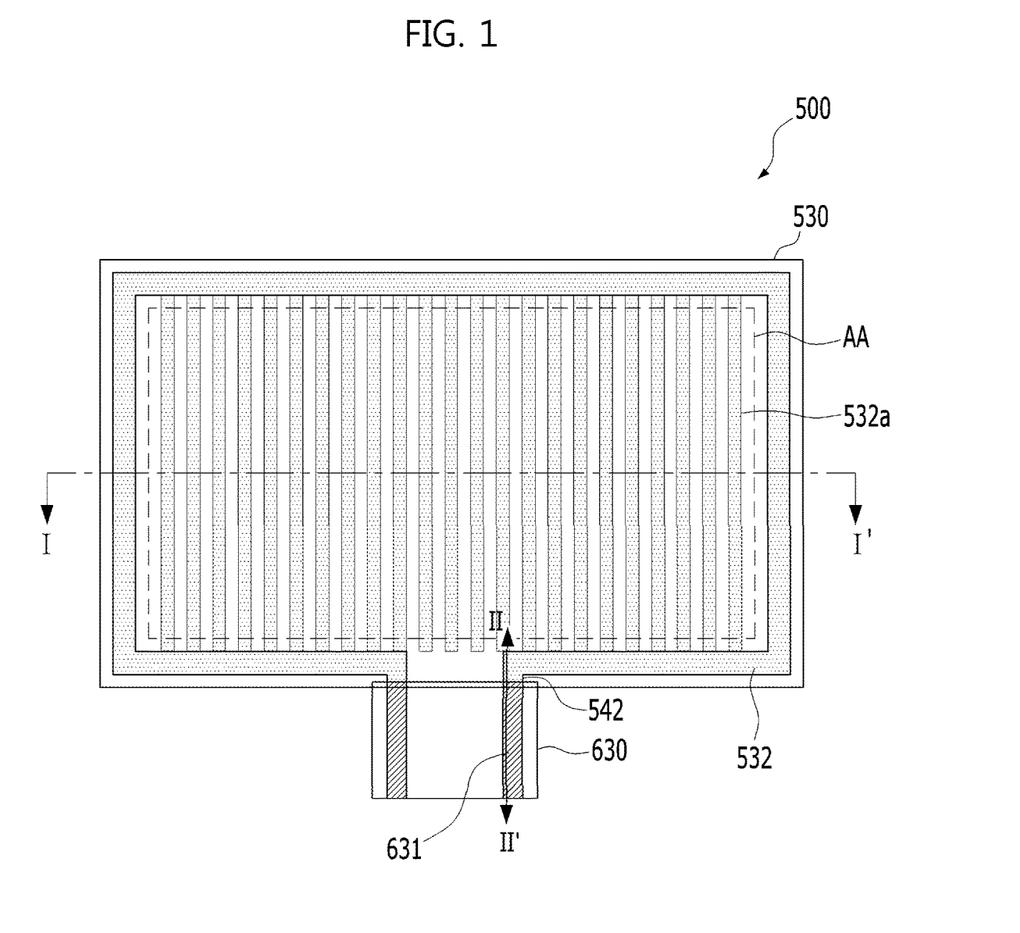
FIG. 1 is a plan view showing an antenna-integrated polarizer according to an aspect of the present disclosure.
Figure 2:
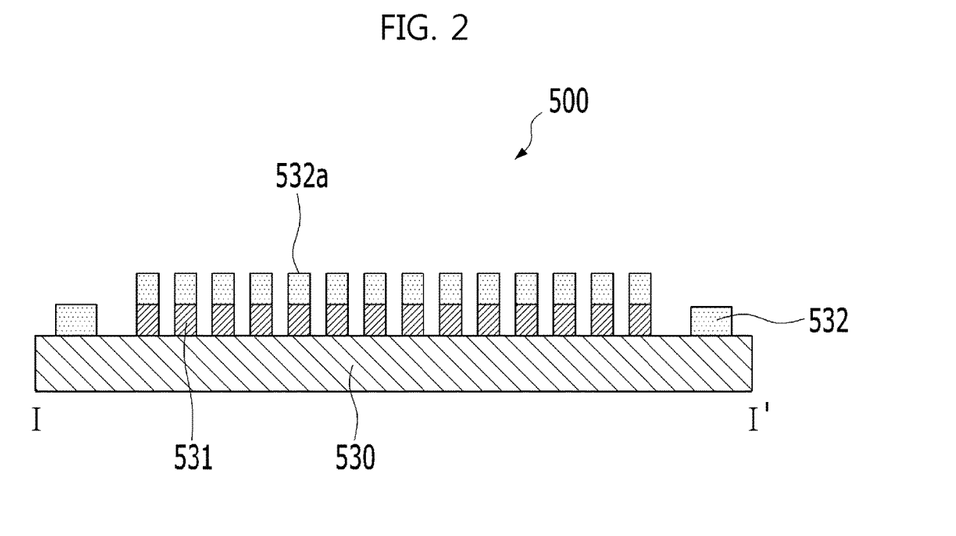
FIG. 2 is a cross-sectional view taken along line I-I' of FIG. 1.
Figure 3:
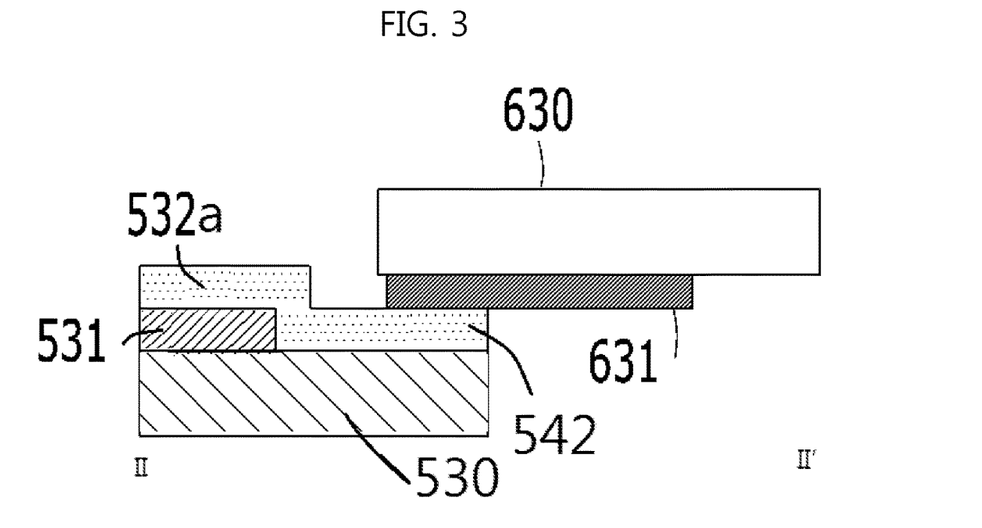
FIG. 3 is a cross-sectional view taken along line II-II' of FIG. 1.

FIG. 1 is a plan view showing an antenna-integrated polarizer according to an aspect of the present disclosure, FIG. 2 is a cross-sectional view taken along line I-I' of FIG. 1, and FIG. 3 is a cross-sectional view taken along line II-II' of FIG. 1.

As shown in FIGS. 1 to 3, an antenna-integrated polarizer 500 according to an aspect of the present disclosure includes a substrate 530 having an active area AA (i.e., display area) and a non-active area (i.e., non-display area) defined outside the active area, a plurality of shading lines 531 having a predetermined width arranged in the active area AA of the substrate 530, and an antenna pattern 532 provided in the dead area so as to surround the active area AA of the substrate 530.

The active area AA is an area through which light is transmitted. In a display device, the active area AA is a display area, i.e. an area in which images are displayed. The antenna-integrated polarizer 500 is a film having a uniform color. When the antenna-integrated polarizer 500 is attached to a display device, the antenna-integrated polarizer 500 transmits light while having a specific linear directivity.

A plurality of metal patterns 532a, which have the same width as the shading lines 531 and are made of a metal or a metal oxide film, are provided on the shading lines 531. Since the metal patterns 532a are made of a metal or a metal oxide film, the metal patterns 532a are conductive. The pitch of the metal patterns 532a is smaller than the wavelength of light that passes through the antenna-integrated polarizer 500, e.g. visible light. When light is transmitted through gaps between the line-shaped metal patterns 532a, therefore, a secondary wave, which vibrates parallel to the metal patterns 532a, is mostly reflected, and a primary wave, which vibrates perpendicular to the substrate 530, is mostly transmitted. Consequently, the light that is transmitted through the antenna-integrated polarizer 500 has a specific linear directivity. The linear directivity enables the same polarization operation to be performed when light is incident on the substrate 530 and is transmitted outside the metal patterns 532a and when light is incident on the metal patterns 532a and is transmitted outside the substrate 530. In the above wire grid structure, the metal patterns 532a are used to reflect most light that is not transmitted for recycling.

For polarization, the pitch of the metal patterns 532a is set to be smaller than the minimum wavelength of visible light, e.g. 300 nm or less. One pitch includes the distance between one metal pattern 532a and another metal pattern 532a adjacent thereto. A ratio of the width to the height of each metal pattern 532a is set to be 1:0.1 to 1:10 such that each metal pattern 532a has a nanoscale size. Depending on the kind of display panel provided under the antenna-integrated polarizer 500, the width and height of each metal pattern 532a may be changed. For example, in the case in which the display panel is an organic light-emitting display device, the height of each metal pattern 532a may be twice or less the width of each metal pattern 532a, since a reduction of reflection efficiency is required.

The metal patterns 532a may be made of aluminum (Al), titanium (Ti), chrome (Cr), silver (Ag), nickel (Ni), gold (Au), an alloy thereof, or an oxide film thereof. Experimentation reveals that the polarization effect is improved when the width, height, and pitch of the metal patterns 532a are set to have a nanoscale size.

Meanwhile, the plurality of shading lines 531 may be located at the light-transmission side, since the plurality of shading lines 531 under the metal patterns 532a are provided to prevent light reflected by the metal included in the metal patterns 532a from being visible. That is, the shading lines 531 may be located near the exit surface, and the metal patterns 532a may be located far away from the exit surface.

The shading lines 531 and the metal patterns 532a may have the same width. The shading lines 531 are provided to prevent the visibility of light in addition to polarization. The thickness of the shading lines 531 may be adjusted in consideration of the reflectance of the metal included in the metal patterns 532a.

Meanwhile, the shading lines 531 may be made of a black organic material, such as carbon or black acryl. Depending on the circumstances, a shading metal may be used. Considering that the antenna-integrated polarizer 500 is attached to a flexible display device, which can be folded, however, the shading lines 531 may be made of an elastic material, such as a black organic material.

The antenna pattern 532, which is located outside the active area AA, may include the same metal as that included in the metal patterns 532a. The metal patterns 532a, which are located in the active area AA, may extend to the non-active area so as to be integrally formed with the antenna pattern 532. In this case, the metal patterns 532a and the antenna pattern 532 may be electrically connected to each other. As a result, a signal flowing in the antenna pattern 532 flows to the region of the active area in which the metal patterns 532a are formed as well as the non-active area, thereby the reception sensitivity of the antenna pattern 532 may be improved.

In order to receive a signal, such as a specific frequency, from the outside, a portion of the antenna pattern 532 that surrounds the active area AA may be open, and signal connection lines 542 may protrude from the opposite open ends of the antenna pattern 532 so as to extend to the edge of the substrate 530. In addition, the signal connection lines 542 may be connected to circuit wires 631 provided in a flexible printed circuit board 630 by bonding.

Depending on the circumstances, the signal connection lines 542 may be connectors or thin film members, which may be connected to a touchscreen, a display panel, or a final host.

Meanwhile, the substrate 530 of the antenna-integrated polarizer 500 may be a transparent film, such as polyethylene terephthalate (PET), or an organic film provided at a display device to which the antenna-integrated polarizer 500 is attached. For example, the substrate 530 may be a protective film of a display panel or one surface of a touchscreen. When the antenna-integrated polarizer 500 is attached to a touchscreen, the inside of the touchscreen, i.e.

the side of the touchscreen opposite to the side on which user input is performed, is located so as to cover the antenna-integrated polarizer 500 such that the electrical operation of the antenna-integrated polarizer 500 does not affect the touchscreen as noise.

From an optical aspect, the substrate 530 may be made of a material that is transparent and does not cause optical retardation, such as non-retardation tri-acetyl-cellulose (NRT). The total thickness of the substrate 530, the shading lines 531, and the metal patterns 532a may be 2 μm or less, thereby the antenna-integrated polarizer 500 may be flexible without breaking when a display device is folded several times in a state in which the antenna-integrated polarizer 500 is attached to the display device.

Meanwhile, although not shown, the antenna-integrated polarizer 500 may serve as a linear polarizer. When a λ/4 plate is laminated to the antenna-integrated polarizer 500, the antenna-integrated polarizer 500 may serve as a circular polarizer. In this case, the shading lines 531 and the metal patterns 532a, which are stacked, and the antenna pattern 532 on the substrate 530 may be covered with a passivation layer (not shown) that can be planarized, and the λ/4 plate is laminated to the passivation layer.

Another Aspect of Antenna-Integrated Polarizer

Figure 4:
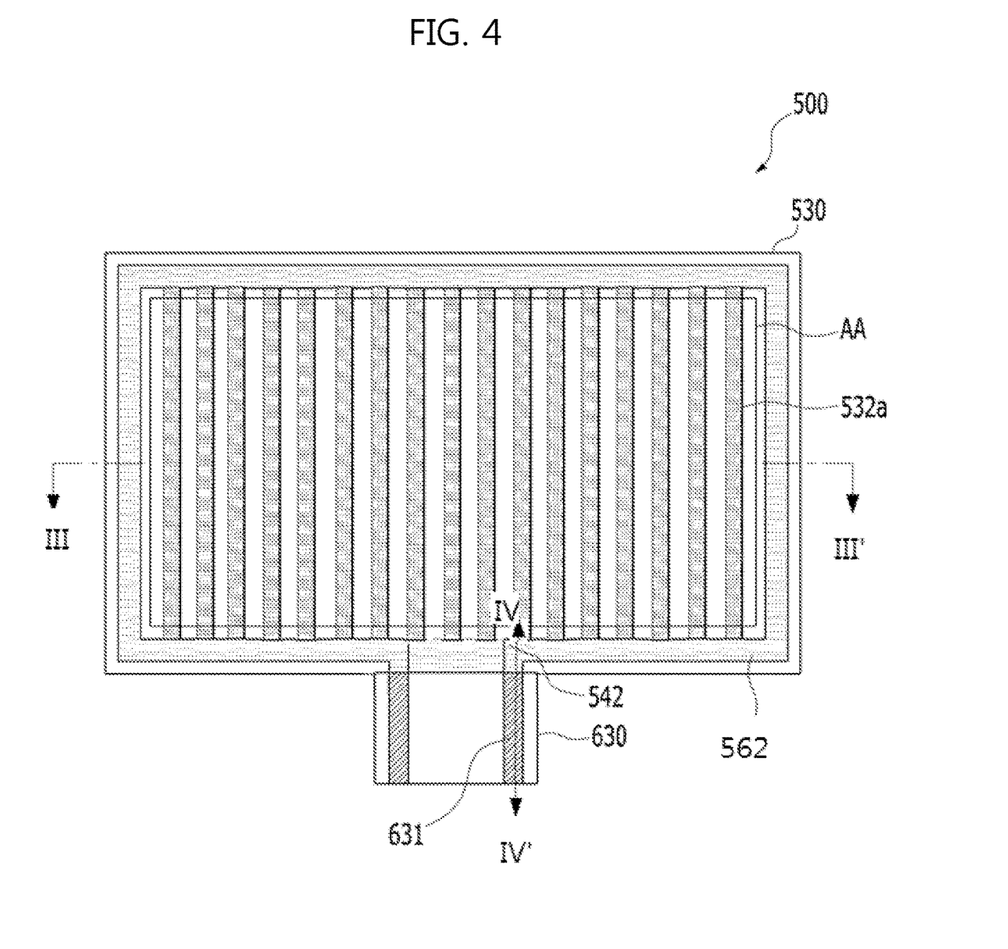
FIG. 4 is a plan view showing an antenna-integrated polarizer according to another aspect of the present disclosure.
Figure 5:
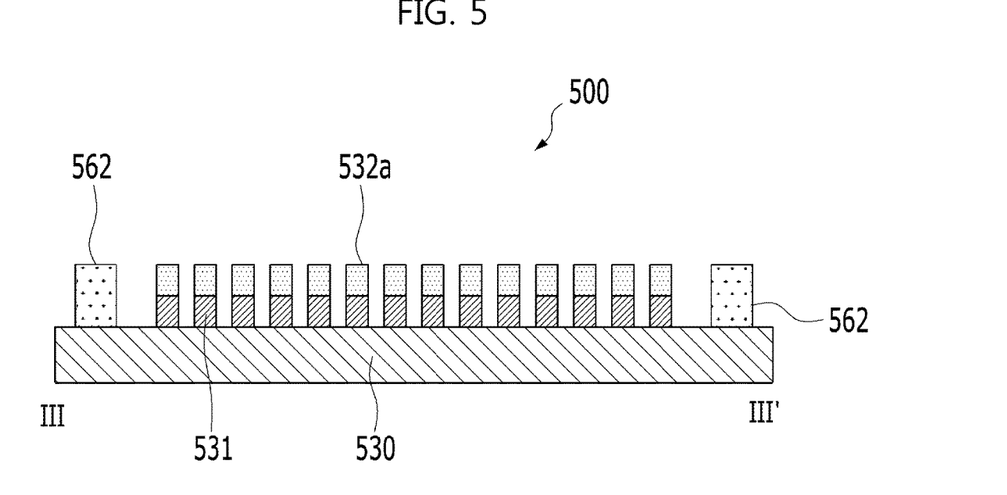
FIG. 5 is a cross-sectional view taken along line III-III' of FIG. 4.
Figure 6:
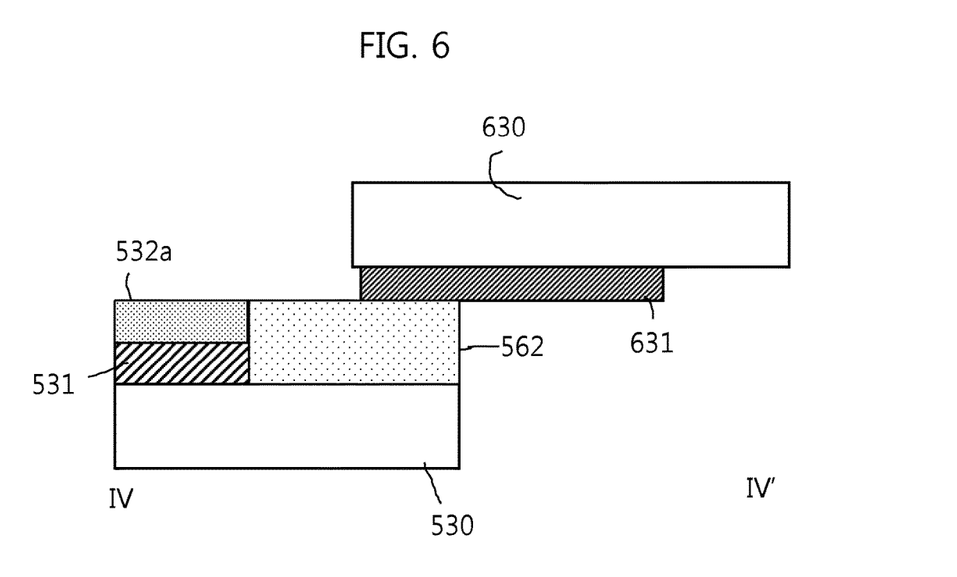
FIG. 6 is a cross-sectional view taken along line IV-IV' of FIG. 4.

FIG. 4 is a plan view showing an antenna-integrated polarizer according to another aspect of the present disclosure, FIG. 5 is a cross-sectional view taken along line III-III' of FIG. 4, and FIG. 6 is a cross-sectional view taken along line IV-IV' of FIG. 4.

As shown in FIGS. 4 to 6, in the antenna-integrated polarizer according to another aspect of the present disclosure, a plurality of metal patterns 532a located in an active area AA and antenna pattern 562 located in a non-active area may be made of different materials. In this case, the antenna pattern 562 may be made of a metal having high conductivity in order to improve the reception sensitivity thereof. In addition, the thickness of the antenna pattern 562 may be greater than that of the metal patterns 532a in the active area.

Even in this case, a portion of the antenna pattern 562 may be open. That is, the antenna pattern 562 is formed in an open ring shape. The antenna pattern 562 is disposed to surround the active area AA. Signal connection lines may be connected to the opposite ends of the open ring.

Shading lines 531 and the metal patterns 532a are identical to those of the antenna-integrated polarizer according to the previously described aspect in terms of construction and operation, and therefore the same description will not be repeated.

Hereinafter, aspects in which the antenna-integrated polarizer according to the present disclosure is applied to a flexible display device will be described.

The antenna-integrated polarizer according to the present disclosure is provided in order to solve a problem in which a general film type polarizer has a thickness of hundreds of μm, which is thick, and in the case in which the film including an antenna provided therein is attached to a flexible display device, it is difficult to fold the flexible display device or to return the flexible display device to the original state thereof due to great repulsive force when the flexible display device is folded.

An Aspect of Flexible Display Device

Figure 7:
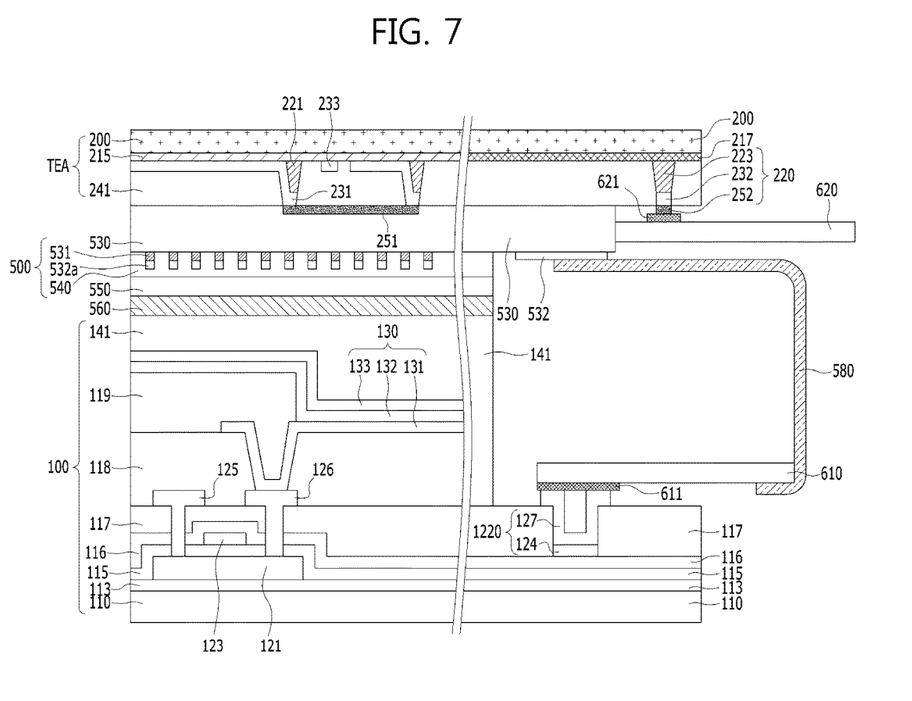
FIG. 7 is a cross-sectional view showing a flexible display device according to an aspect of the present disclosure.

FIG. 7 is a cross-sectional view showing a flexible display device according to an aspect of the present disclosure.

As shown in FIG. 7, the flexible display device according to an aspect of the present disclosure may include a cover window 200 having a first surface and a second surface, a shading pattern 217 disposed along the edge of the first surface of the cover window 200, a touch electrode array TEA provided on the first surface of the cover window 200 inside the shading pattern 217, a routing wire 221 and a touch pad electrode 220 provided on the shading pattern 217, a first passivation film 530 located to cover the touch electrode array TEA and the routing wire 221, an antenna-integrated polarizer 500 according to the first or second aspect located on the first passivation film 530, which serves as a substrate, a second passivation film 540 located to cover the first passivation film 530, including shading lines 531, metal patterns 532a, and an antenna pattern 532 or 562 of the antenna-integrated polarizer 500, a λ/4 plate 550 located to abut the second passivation film 540, and a display panel 100 located to abut the λ/4 plate 550.

An adhesive layer 560 is provided between the λ/4 plate 550 and the display panel 100 in a surface contact state.

Specifically, the antenna-integrated polarizer 500 includes a plurality of shading lines 531 having a predetermined width arranged on the first passivation film 530 inside the shading pattern 217, metal patterns 532a, which have the same width as the shading lines 531, provided on the shading lines 531, and an antenna pattern 532 provided on the first passivation film 530 so as to partially overlap the shading pattern 217.

The display panel 100 includes a plurality of subpixels in an active area. Each subpixel includes at least one thin film transistor and an organic light-emitting diode 130.

In the display panel 100, a plurality of inorganic buffer layers 113 is formed on a TFT substrate 110. The thin film transistor and the organic light-emitting diode 130 are formed in an active area AA, and an array pad electrode 1220 is formed in a non-active area NA.

The thin film transistor is configured by forming an active layer 121 on a predetermined portion of the inorganic buffer layer 113, forming a gate dielectric film 115 so as to cover the active layer 121, forming a gate electrode 123 on the gate dielectric film 115 at the portion that overlaps the active layer 121, forming a first interlayer dielectric film 116 so as to cover the gate electrode 123, forming a second interlayer dielectric film 117, and selectively removing the second interlayer dielectric film 117, the first interlayer dielectric film 116, and the gate dielectric film 115 such that opposite ends of the active layer 121 are exposed to form a drain electrode 125 and a source electrode 126 that are connected to the exposed opposite ends of the active layer 121.

A passivation film 118 is formed so as to cover the drain electrode 125 and the source electrode 126, a contact hole, through which a portion of the source electrode 126 is exposed, is formed, and a first electrode 131, which is connected to the source electrode 126 exposed through the contact hole, is formed on the passivation film 118.

Meanwhile, in the non-active area NA, a first pad pattern 124 is formed using the same process as that for forming the gate electrode 123, and a second pad pattern 127, which is located on the first pad pattern 124, is formed using the same process as that for forming the drain electrode 125 and the source electrode 126. The first pad pattern 124 and the second pad pattern 127 may be stacked to constitute a pad electrode 1220.

The upper part of the pad electrode 1220 may be connected to a first connection pattern 611 provided in a first flexible printed circuit board 610. The first flexible printed circuit board 610 may be folded under the TFT substrate 110.

Subsequently, a bank 119, which partially overlaps the edge of the first electrode 131 to define an emissive part, is formed.

Subsequently, an organic emissive layer 132 and a cathode 133 are sequentially formed on the bank 110 and the first electrode 131.

The first electrode 131, the organic emissive layer 132, and the cathode 133 are stacked to constitute an organic light-emitting diode 130.

In addition, an encapsulation part 141 is provided at the uppermost side of the display panel 100 so as to cover the top and the side of the organic light-emitting diode 130. The encapsulation part 141 extends to a portion of the non-active area NA while sufficiently covering the active area AA, and is removed at the portion at which the pad electrode is located. The encapsulation part 141 may be a stack in which an inorganic film and an organic film are stacked. At least, a plurality of inorganic films is provided.

The display panel 100 shown in the figure is an organic light-emitting display panel. Depending on the circumstances, any other kind of elastic display panel may be used.

The TFT substrate 110 may be a surface on which the thin film transistor array is directly formed. Alternatively, the TFT substrate 110 may be a back plate configured by forming a thin film transistor and an organic light-emitting diode array in the state in which a glass substrate is provided under the buffer layer 113, laminating an antenna-integrated polarizer to a touchscreen, and removing the glass substrate. The back plate is provided for mechanical protection of the buffer layer 113 and fastening in the structure.

Meanwhile, the touch electrode array TEA is reversed such that the first passivation film 530 faces the antenna-integrated polarizer 500 so as to cover the upper surface on which the touch electrode array TEA is formed. In this case, the first passivation film 530 serves as a substrate of the antenna-integrated polarizer 500. Consequently, the shading lines 531 and the antenna pattern 532 are disposed on the surface of the first passivation film 530 by patterning.

Meanwhile, the touch electrode array TEA is directly formed on the cover window 200. The touch electrode array TEA includes a first electrode 231 and a second electrode 233, which intersect each other.

The first electrode 231 and the second electrode 233 are connected to a metal mesh, which is located under the first electrode 231 and the second electrode 233. The second electrode 233 is a pattern disposed in a direction that intersects the direction in which the first electrode 231 extends. Although the metal mesh is not shown in the figure, the second electrode 233 may be provided at a portion thereof that does not intersect the first electrode 231 with a metal mesh.

The first electrode 231 and the second electrode 233 are electrically isolated from each other. On a layer different from the second electrode 233, the first electrode 231 is connected to another adjacent first electrode 231 via a bridge electrode 251. Reference numeral 241 indicates an interlayer dielectric film that isolates the bridge electrode 251 and the second electrode 233 from each other.

Meanwhile, the touch electrode array TEA is defined in the active area AA of the cover window 200. The dead area of the cover window 200 is covered by the shading pattern 217, which is made of a black organic material.

Consequently, it is possible to prevent the reflection of light by metals included in the routing wire 221 and the touch pad electrode 220, which are located on the shading pattern 217 in the dead area in an overlapping state.

Meanwhile, the cover window 200 is a thin glass film or a transparent optical film, which is provided to protect a touch surface.

The first surface of the cover window 200 may be used as a surface on which the touch electrode array TEA and the shading pattern 217 are formed. The second surface of the cover window 200 may be a touch surface or an image display surface.

Meanwhile, the routing wire 221 may be covered by the interlayer dielectric film 241.

The touch pad electrode 220 may include a first metal mesh layer 223, a second transparent electrode layer 232, which constitutes the first and second electrodes, and a third bridge electrode layer 252. Depending on the circumstances, any one of the layers may be omitted.

The touch pad electrode 220 may be connected to a second connection pattern 621 provided in a second flexible printed circuit board 620 to receive an electrical signal for driving the touch electrode array TEA. The antenna pattern located in the dead area of the antenna-integrated polarizer 500 and the signal connection lines 542 connected thereto may be connected to the first flexible printed circuit board 610 via a connector 580 or a film. Although schematically shown in FIG. 7, the first flexible printed circuit board 610 may be folded along the lower surface of the TFT substrate 110 when the first flexible printed circuit board 610 contacts the lower surface of the TFT substrate 110.

Meanwhile, the antenna-integrated polarizer 500 includes a plurality of shading lines 531 having a predetermined width arranged on the first passivation film 530 inside the shading pattern 217, metal patterns 532a, which have the same width as the shading lines 531, provided on the shading lines 531, and an antenna pattern 532 provided on the first passivation film 530 so as to partially overlap the shading pattern 217.

The second passivation film 540 is provided to cover the shading lines 531 on the first passivation film 530, the metal patterns 532a, and the antenna pattern 532, which is electrically connected to the metal patterns 532a. Furthermore, the second passivation film 540 is provided for surface planarization.

In addition, the λ/4 plate 550, which is a phase-difference plate, is provided so as to abut the second passivation film 540. The λ/4 plate 550 and the antenna-integrated polarizer 500 cooperate to prevent external light incident from above from exiting to the outside after being reflected by the electrode of the organic light-emitting diode 130. That is, a reflection prevention function is performed.

In addition, the antenna pattern 532 of the antenna-integrated polarizer 500 receives a signal, such as a specific frequency, from the outside.

The antenna pattern 532 overlaps the shading pattern 217 of the touchscreen. Consequently, wires constituting the antenna pattern 532 may be prevented from being visible.

Meanwhile, the TFT substrate 110 of the display panel 100 is a thin organic film or a thin plastic film. A glass parent substrate and/or a sacrificial layer (not shown) is prepared, the TFT substrate 110 is applied thereto, and a subsequent array forming process may be performed with respect to a plurality of unit regions.

The glass parent substrate, on which the array forming process has been performed, is laminated to a cover window glass substrate having a plurality of touchscreen regions, the upper glass substrate is scribed and cut with respect to the respective touchscreen regions on the basis of the shading pattern 217, and the lower glass substrate is scribed and cut with respect to the unit regions. As a result, the glass parent substrate and the sacrificial layer may be removed. The glass parent substrate may be removed by application of a laser.

Meanwhile, the elements of the touch pad electrode 220 and the elements of the array pad electrode 1220 are shown as overlapping each other in this example. However, the present disclosure is not limited thereto. In a planar state, the elements of the touch pad electrode 220 and the elements of the pad electrode 1220 may be disposed in different regions. Depending on the circumstances, the signal connection lines of the antenna-integrated polarizer 500 and the elements of the touch pad electrode 220 may be differently disposed in a planar state such that the touch pad electrode 220 and the array pad electrode of the display panel 100 under the touch pad electrode 220 may be vertically bonded to an auxiliary pad electrode formed through the same process. When the touch pad electrode and the auxiliary pad electrode are vertically connected to each other by bonding, the flexible printed circuit board may be provided only at a position of the display panel corresponding to the array pad electrode. In this case, the signal connection lines of the antenna-integrated polarizer 500 may also be vertically connected to an additional auxiliary pad electrode of the display panel 100 by bonding.

Another Aspect of Flexible Display Device

Figure 8:
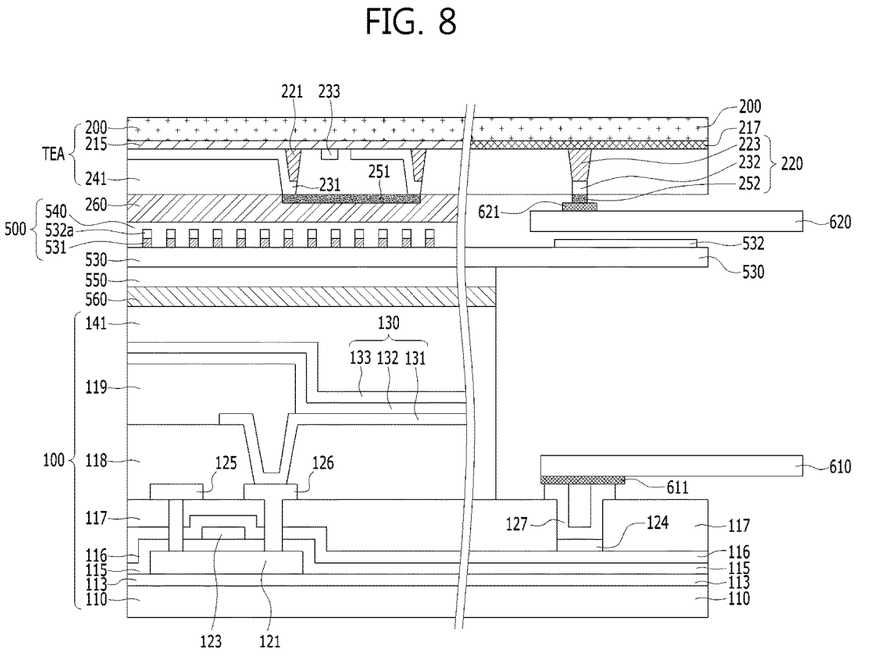
FIG. 8 is a cross-sectional view showing a flexible display device according to another aspect of the present disclosure.

FIG. 8 is a cross-sectional view showing a flexible display device according to a second aspect of the present disclosure.

As shown in FIG. 8, the flexible display device according to another aspect of the present disclosure is different from the flexible display device according to the aspect of the present disclosure in that the antenna-integrated polarizer 500 is reversed as shown in FIG. 7.

In this case, the substrate 430 abuts the λ/4 plate 550. The shading lines 531 and the metal patterns 532 are disposed in the active area AA of the substrate 430, and the antenna pattern 532 is provided in the dead area of the substrate 530.

In addition, the signal connection lines 542, which supply a signal to the antenna pattern 532, are connected to the second flexible printed circuit board 620, which supplies a signal to the touch pad electrode 220. The second flexible printed circuit board 620 is a film having two branches extending to the antenna-integrated polarizer 500 and the touchscreen. The two branches of the second flexible printed circuit board 620 are integrated into one while extending downward. The second flexible printed circuit board 620 may be folded downward under the TFT substrate 110 together with the first flexible printed circuit board 610.

Meanwhile, the other parts of the flexible display device according to another aspect of the present disclosure are identical to those of the flexible display device according to the aspect of the present disclosure shown in FIG. 7, and therefore a duplicate description will be omitted.

Figure 9:
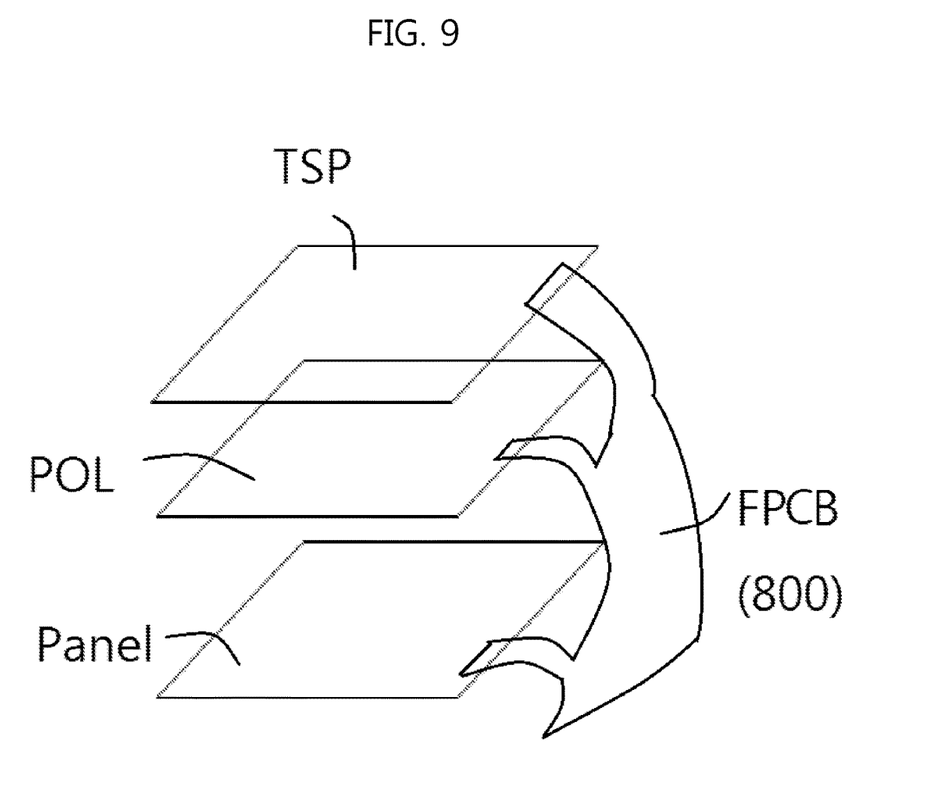
FIG. 9 is a cross-sectional view showing a flexible display device according to yet another aspect of the present disclosure.

FIG. 9 is a cross-sectional view showing a flexible display device according to yet another aspect of the present disclosure.

As shown in FIG. 9, a flexible printed circuit board 800 is formed so as to have three branches such that a touch electrode of a touch screen, signal connection lines of an antenna-integrated polarizer 500, and an array pad electrode of a display panel are connected to each other, thereby achieving electrical connection.

The flexible display device according to the present disclosure has a cover-window-integrated touchscreen. In this case, a routing wire 221 and a touch pad electrode 220 are provided under a shading pattern provided in a non-active area of a cover window (shown in FIGS. 7 and 8), and a touch electrode array TEA is provided in an active area. In addition, a plurality of bar-shaped shading lines 531 and metal patterns 532a stacked thereon are provided on a first passivation film 530 made of an organic film, which covers the touch electrode array TEA and the routing wire 221, serves as a barrier, and is also provided for planarization, so as to perform polarization. Simultaneously with the formation of the metal patterns 532a, an antenna pattern 532, which is electrically connected to the metal patterns 532a, is provided in the dead area. The antenna pattern 532 is formed in the polarizer without the provision of any additional film for the antenna. Consequently, the flexible display device is slimmed, and therefore it is possible to prevent repulsive force from being generated when the flexible display device is folded, thereby improving the reliability of the flexible display device.

In addition, the antenna-integrated polarizer 500 is located closer to the display panel 100 than to the touchscreen. When the touchscreen is operated according to an external touch input operation, therefore, it is possible to prevent interference with the antenna-integrated polarizer 500, to which an electrical signal is supplied.

In the antenna-integrated polarizer 500, which is located further inward than the touchscreen, the metal patterns 532a, which are connected to the antenna pattern 532, are disposed in the active area, although the antenna pattern 532 is simply formed in a ring shape. Consequently, the reception area of the antenna is increased, whereby the reception sensitivity of the antenna is improved.

As is apparent from the above description, the antenna-integrated polarizer according to the present disclosure and the flexible display device using the same have the following effects.

First, the polarizer is defined by the active area and the non-active area, the wire grid is provided in the active area, the antenna pattern is formed in the non-active area, and the metal or the metal oxide film is provided on the wire grid in the active area. Consequently, the entire area of the polarizer can be used as an antenna, thereby improving electrical reception sensitivity.

Second, the antenna integrated into the polarizer is provided between the touchscreen and the organic light-emitting display panel, whereby it is possible to further provide an antenna function without increasing the thickness of the display device. In addition, the polarizer is configured so as to be flexible. Consequently, the flexible display device can be easily folded, and a specific portion of the flexible display device is easily bent, whereby the flexible display device can easily return to the original state thereof.

Third, an antenna made of a specific material has a problem related to visibility of the material constituting the antenna. In the present disclosure, the wire grid in the active area is made of a black material, and the transparent metal or metal oxide film is provided on the wire grid. Consequently, it is possible to prevent the antenna-integrated polarizer from being visible, thereby solving a problem related to the visibility of the display device.

Features, structures, effects, etc. previously described in connection with the aspects are included in at least one aspect of the present disclosure and not necessarily in only one aspect. Furthermore, the features, structures, effects, etc. of each aspect of the present disclosure may be combined in any suitable manner with one or more other aspects, or may be changed by those skilled in the art to which the aspects pertain. Therefore, it is to be understood that contents associated with such combination or change fall within the scope of the present disclosure. In addition, although the present disclosure has been described with reference to aspects thereof, the aspects are therefore to be construed in all aspects as illustrative and not restrictive. It should be understood that numerous other modifications and applications may be devised by those skilled in the art that will fall within the intrinsic aspects of the aspects. For example, various variations and modifications are possible in concrete constituent elements of the aspects.

What is claimed is:

1. An antenna-integrated polarizer comprising: a substrate having an active area and a non-active area defined outside the active area; a plurality of shading lines having a width disposed in the active area; a plurality of metal patterns having a same width as the plurality of shading lines and disposed on the plurality of shading lines; an antenna pattern disposed in the non-active area surrounding the active area; a planarization film disposed on the substrate having the plurality of shading lines and the plurality of metal patterns to cover the active area; and a λ/4 plate disposed on the planarization film.

2. The antenna-integrated polarizer according to claim 1, wherein the antenna pattern is formed of a same material as the plurality of metal patterns.

3. The antenna-integrated polarizer according to claim 1, wherein the plurality of metal patterns has an edge electrically connected to the antenna pattern.

4. The antenna-integrated polarizer according to claim 1, wherein the plurality of metal patterns are formed of aluminum, titanium, chrome, silver, nickel, gold, or an oxide film.

5. The antenna-integrated polarizer according to claim 1, wherein the plurality of shading lines is formed of an organic shading material.

6. The antenna-integrated polarizer according to claim 1, further comprising: a signal connection line connected to the antenna pattern, the signal connection line extending outward from a portion of one side of the substrate, wherein the signal connection line is connected to a flexible printed circuit board protruding from the one side of the substrate.

7. The antenna-integrated polarizer according to claim 1, further comprising a touchscreen attached to a surface of the substrate where the plurality of shading lines is not formed.

8. A flexible display device comprising: a cover window having a first surface and a second surface; a shading pattern disposed along an edge of the first surface of the cover window; a touch electrode array provided on the first surface of the cover window inside the shading pattern; a routing wire and a touch pad electrode disposed on the shading pattern; a first passivation film covering the touch electrode array and the routing wire; a plurality of shading lines having a width disposed on the first passivation film inside the shading pattern; a plurality of metal patterns having a same width as the plurality of shading lines on the shading lines; an antenna pattern disposed on the first passivation film partially overlapping the shading pattern; a second passivation film covering the first passivation film, the plurality of shading lines, the plurality of metal patterns, and the antenna pattern; a λ/4 plate adjacent to the second passivation film; and a display panel adjacent to the λ/4.

9. The flexible display device according to claim 8, further comprising: a signal connection line connected to the antenna pattern, the signal connection line extending outward from a portion of one side of the substrate, wherein the signal connection line is connected to a flexible printed circuit board protruding from the one side of the substrate.

10. The flexible display device according to claim 8, further comprising a first flexible printed circuit board connected to the touch pad electrode and to the antenna pattern.

11. The flexible display device according to claim 10, wherein the display panel has one side connected to a second flexible printed circuit board, and the first flexible printed circuit board is electrically connected to the second flexible printed circuit board.

12. The flexible display device according to claim 8, further comprising: a first flexible printed circuit board connected to the touch pad electrode; and a second flexible printed circuit board connected to one side of the display panel.

13. The flexible display device according to claim 12, wherein the antenna pattern has a portion connected to a connector comprising a signal connection line protruding outward from the first passivation film, and the connector is connected to the first flexible printed circuit board or to the second flexible printed circuit board.

14. A flexible display device having an antenna integrated polarizer, comprising: a cover window including an active area and a non-active area; a shading pattern disposed under the cover window integrated touchscreen in the non-display area; a routing wire and a touch pad electrode disposed under the shading pattern in the non-active area; a touch electrode array disposed in the active area; a plurality of shading lines having a width disposed on the active area; a plurality of metal patterns on the plurality of shading lines and having a same width as the plurality of shading lines, wherein the plurality of shading lines and the plurality of metal patterns cover the touch electrode array and the routing wire and perform polarization; an antenna pattern electrically connected to the plurality of metal patterns; a planarization film disposed on the substrate having the plurality of shading lines and the plurality of metal patterns to cover the active area; and a λ/4 plate disposed on the planarization film.

15. The flexible display device according to claim 14, wherein the antenna pattern is formed of a same material as the plurality of metal patterns.

16. The flexible display device according to claim 14, wherein the plurality of metal patterns has an edge electrically connected to the antenna pattern.

17. The flexible display device according to claim 14, wherein the plurality of metal patterns are formed of aluminum, titanium, chrome, silver, nickel, gold, or an oxide film.

18. The flexible display device according to claim 14, wherein the plurality of shading lines is formed of an organic shading material.

19. The flexible display device according to claim 14, further comprising a signal connection line connected to the antenna pattern and extending outward from a portion of one side of the substrate, wherein the signal connection line is connected to a flexible printed circuit board protruding from the one side of the substrate.

20. The flexible display device according to claim 14, further comprising a touchscreen attached to a surface of a substrate where the plurality of shading lines is not formed.

* * * * *